United States Patent [19]

Jaddam

[11] 3,789,504

[45] Feb. 5, 1974

[54] METHOD OF MANUFACTURING AN N-CHANNEL MOS FIELD-EFFECT TRANSISTOR

[75] Inventor: Abdulmassih Y. Jaddam, Whitestone, N.Y.

[73] Assignee: GTE Laboratories Incorporated, Waltham, Mass.

[22] Filed: Oct. 12, 1971

[21] Appl. No.: 188,205

[52] U.S. Cl. ........................ 29/571, 29/578, 148/187

[51] Int. Cl. ............................................... B01j 17/00

[58] Field of Search ........... 29/571, 578; 317/235 B; 148/187

[56] References Cited

UNITED STATES PATENTS 3,417,464 12/1968 Fang ................................ 317/235 B 3,430,112 2/1969 Hilbourne ....................... 317/235 B

*Primary Examiner*—Charles W. Lanham
*Assistant Examiner*—W. Tupman
*Attorney, Agent, or Firm*—Irving M. Kriegsman; Robert A. Walsh

[57] ABSTRACT

The process for fabricating an N-channel enhancement type field-effect semiconductor device includes the step of implanting impurity atoms to form a channel region in a high resistivity substrate between the source and drain regions. By utilizing ion implantation, the amount and location of impurities can be accurately controlled. During the subsequent growth of the gate oxide layer, the impurity distribution is changed to provide a semiconductor device having the desired operating characteristics.

12 Claims, 16 Drawing Figures

Patented Feb. 5, 1974

3,789,504

3 Sheets-Sheet 1

METHOD OF MANUFACTURING AN N-CHANNEL MOS FIELD-EFFECT TRANSISTOR

BACKGROUND OF THE INVENTION

The invention relates to metal-oxide-semiconductor (MOS) field-effect transistors and more particularly to a process for forming an n-channel enhancement type MOS transistor.

Generally, MOS transistors may be categorized as either p-channel or n-channel units depending upon the conduction process which takes place within the device. The p-channel units rely on hole conduction between p-type drain and source regions while n-channel units utilize electron conduction between source and drain region. Each device may further be categorized as operating in either the enhancement mode or depletion mode. Depletion mode transistors exhibit substantial channel conductance at zero channel voltage and are normally "on." Enhancement mode transistors exhibit the usually more desirable characteristic of having no channel conductance at zero channel bias and are normally "off." Since the n-channel device inherently operates faster than the p-channel device, the development of an n-channel enhancement type MOS transistor is desirable, however, prior manufacturing processes have not produced satisfactory n-channel devices.

In an n-channel device, the source and drain regions are formed of heavily doped n-type material which is diffused in a p-type substrate. The p-type material extending between the n-type regions forms a channel. A layer of oxide material, referred to as the gate oxide, is formed over the channel and extends partially into the source and drain regions. Metal layers are formed over the source and drain regions and the oxide layer to provide the source, drain and gate electrodes respectively.

Formation of the gate oxide layer causes a depletion of the p-type dopant in the channel causing the channel to become less positively charged. For this reason, substrates for n-channel enhancement devices have required a high doping concentration (on the order of 2 $\times 10^{16}/cm^3$ resulting in a material having resistivity in the order of 1 ohm-cm) to prevent full depletion of the p-type charge carriers in the channel during the formation of the gate oxide layer. N-channel enhancement type MOS transistors manufactured in low resistivity substrates however exhibit the undesirable characteristics of having relatively low breakdown voltage and relatively high junction capacitance which decreases the operating speed of the device. In addition, the threshold voltage, that is, the voltage required at the gate electrode to turn the transistor on, is variable and dependent upon a back bias voltage applied between the substrate and source. It is therefore desirable to use a high resistivity substrate which exhibits a lower junction capacitance, higher speed and higher breakdown voltage. However, when the doping level of the substrate is reduced to about $10^{15}/cm^3$, which increases the resistivity to about 15 ohm-cm, depletion of the p-type impurities during the growth of the gate oxide layer causes an inversion layer to form on the surface of the substrate thus producing a depletion mode device.

This invention is directed to a process whereby a layer of p-type material is formed in a controlled manner at the surface of a p-type substrate preferably having high resistivity so as to provide an improved p-channel enhancement MOS transistor.

SUMMARY OF THE INVENTION

The process for forming the n-channel enhancement field-effect semiconductor device of this invention comprises the steps of forming two spaced apart regions of low resistivity material having n-type conductivity in a substrate having p-type conductivity. Preferably, the resistivity of the substrate is at least 100 ohm-cm. A layer of p-type material is then implanted in the substrate in the region between the two regions of n-type conductivity material. A layer of insulating material is formed on the surface of the substrate overlaying the layer of p-type material and partially overlaying the regions of n-type material. Formation of the layer of insulating material causes the resistivity of the p-type material between the regions of high resistivity n-type material to exhibit low resistivity, preferably about 1 ohm-cm. Metal layers are then formed on each region of n-type material and on the insulating material to complete the device.

DESCRIPTION OF THE PREFERRED EMBODIMENT

Figure 1:
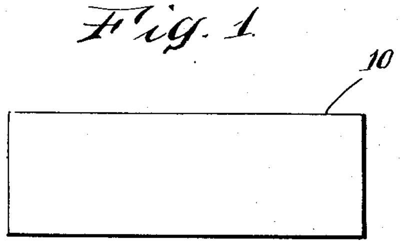
FIGS. 1 – 13 show the successive steps in forming an n-channel enhancement field-effect semiconductor device.
Figure 2:
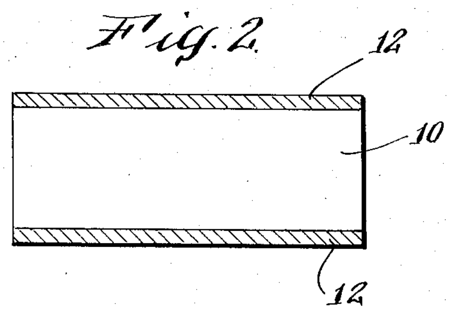
Figure 3:
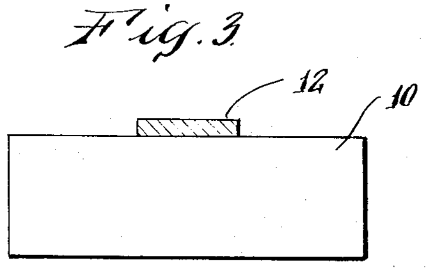
Figure 4:
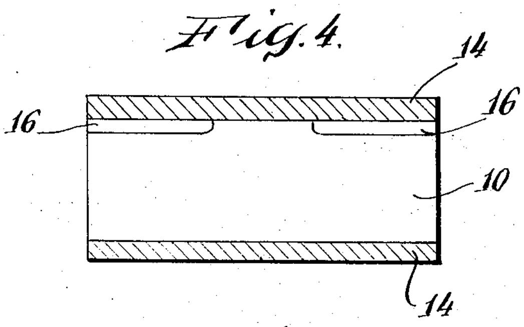
Figure 5:
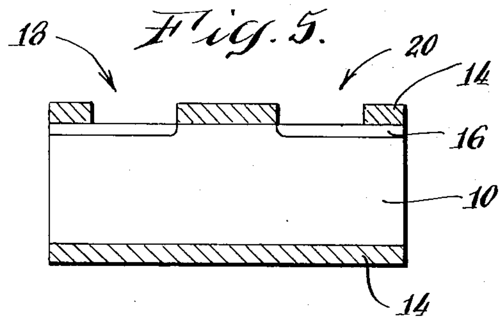
Figure 6:
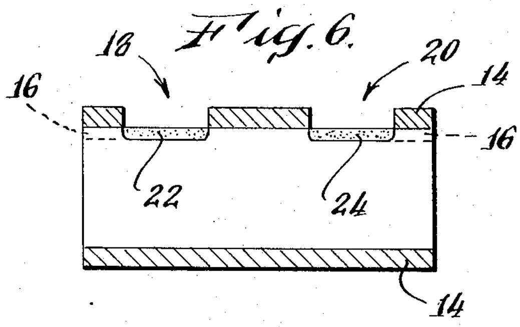
Figure 7:
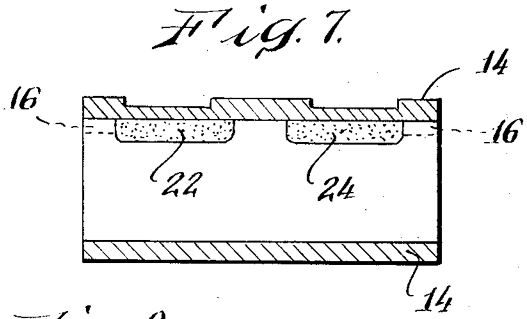
Figure 8:
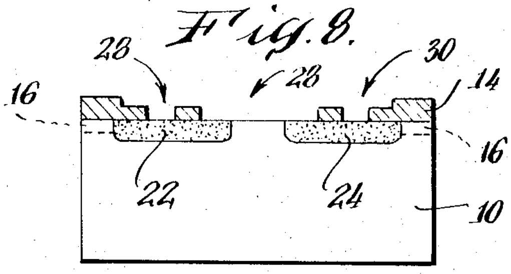

Referring now to the Figures there is shown the procedure for forming the n-channel enhancement MOS transistor of this invention. FIG. 1 shows a substrate 10 of p-type material. The resistivity of the substrate is preferably greater than 100 ohm-cm however the transistors may be fabricated in a substrate having a lower resistivity. An oxide layer 12 (FIG. 2) is grown on the upper and lower surfaces of substrate 10. This layer is conventionally about 5,000 A thick and is usually formed of silicon dioxide by means of thermal oxidation of the substrate. The oxide layer is then subjected to standard photoresist and is etched away from all surfaces of the substrate except for a small area overlaying the region of the substrate which will be the channel region of the device (FIG. 3). A second oxide layer (FIG. 4) is now deposited on the substrate. This oxide layer is doped with boron to a concentration of about $10^{18}/cm^3$. During a high temperature bake-out the boron diffuses into the surface of the substrate in those regions not protected by oxide layer 12 and forms a sheet of p-type material 16 near the surface of the substrate. This sheet which has a concentration of about 2 $\times 10^{16}/cm^3$ with a sheet resistivity of about 1300 ohms/-square is formed to isolate the transistor from other devices which might be formed in the same substrate. The oxide which is used as the boron source is then removed by conventional techniques and an oxide layer 14 is thermally grown to a thickness of about 12,000 A (FIG. 4). Openings 18 and 20 are then formed in oxide layer 14 to expose separate portions of the silicon surface (FIG. 5). The exposed regions are then doped with an n-type material, such as phosphorus, to form the source region 22 and drain region 24 of the transistor (FIGS. 6 and 7). It is preferred that the source and drain regions be formed in a two step operation. In the first step, phosphorus is deposited in regions 22 and 24 to a sheet resistivity of about 2 ohms/square. Following this initial deposition step, the phosphorus is diffused into regions 22 and 24 until a junction depth of about 2 $\mu$m is formed and a sheet resistance of about 10 ohms/square is obtained. An oxide layer is then grown to cover the source and drain regions (FIG. 7).

Figure 9:
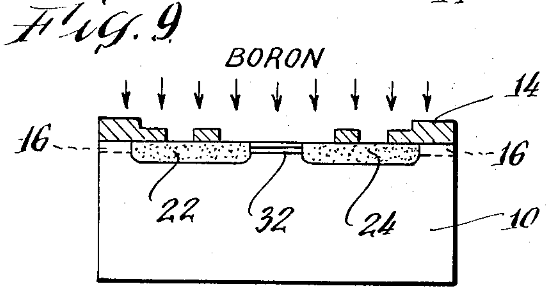
Figure 10:
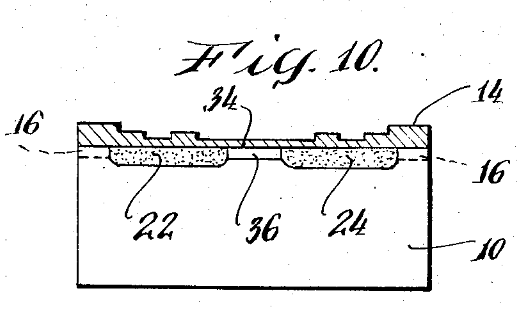

Using conventional photoresist and etching techniques, the oxide layer is removed from the lower surface of substrate 10, and suitable openings 26, 28 and 30 are formed in the upper layer of the oxide coating to expose the source, gate and drain regions respectively. P-type impurity atoms, such as boron, are next implanted (FIG. 9) into the substrate with the impurity density and depth of penetration being chosen so as to provide a predetermined threshold voltage for the transistor device. The implanted atoms form a layer 32 proximate the surface of substrate 10 between the source and drain regions 22 and 24. Although impurity atoms are also implanted in the source and drain regions, the properties of these two regions are not affected. By providing openings 26 and 30 at the same time the opening 28 is provided, the subsequent processing steps are simplified since the oxide layers subsequently formed in the source, gate and drain regions will all be of equal thickness. If desired, only opening 28 may be formed prior to ion implantation. An oxide layer is now grown over the exposed regions on the surface of the substrate (FIG. 10). A portion of this oxide layer forms the gate oxide layer 34. During the growth of the gate oxide layer the implantation profile of the impurity is changed due to the diffusion of impurity atoms toward the substrate surface and into the oxide layer and channel region 36 is formed.

Figure 11:
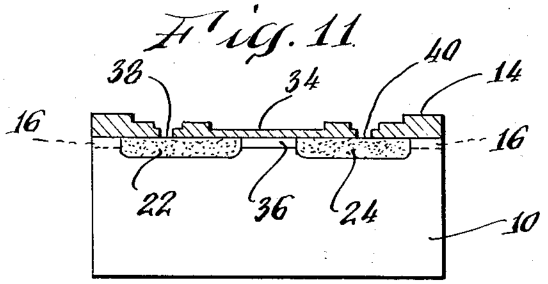
Figure 12:
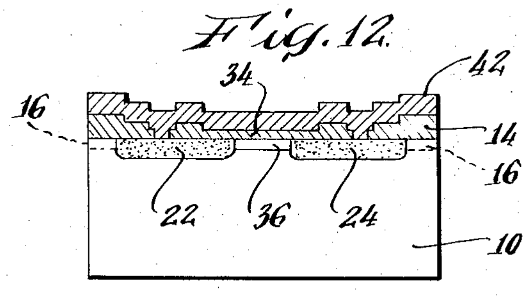
Figure 13:
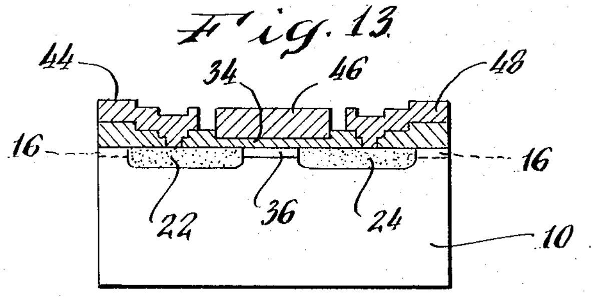

Suitable openings, 38 and 40, are again opened in the surface of the oxide layer to expose the source and drain regions 22 and 24 (FIG. 11). A metal, typically aluminum, is evaporated over the entire surface of the device (FIG. 12) forming layer 42. The aluminum layer is then etched away (FIG. 13) to form the source, gate and drain electrodes 44, 46 and 48, respectively, and the interconnections to the remainder of the circuit.

The ion implantation step which permits accurate control over the impurities within a high resistivity substrate is carried out in a conventional ion implantation apparatus. In this apparatus, a source of ions, which in the case of boron could be boron trichloride, is vaporized to produce a beam of neutral atoms which pass into an ion plasma region of the apparatus. The atoms are ionized by a beam of electrons which is accelerated into the ion plasma region. The positive ions thus formed are confined to the ion plasma by a magnetic field produced by an appropriate electromagnet. Adjacent to the ion plasma region is a plate having a small aperture therein. A large negative potential is applied to the plate causing the positive ions to be accelerated through the aperture in the plate. The ions thus extracted from the plasma pass through a mass analyzer which allows only the desired ions to pass through and be focused on the substrate. The apparatus also includes a beam sweeping mechanism at the output of the mass analyzer which provides a means for sweeping the ions across the surface of the substrate. More information concerning the ion implantation can be found in the book titled "Ion Implantation In Semiconductors" by James W. Meyer, Lennert Eriksson and John A. Davies, published by Academic Press, 1970.

The required impurity density and width of the depletion region to provide a device with a selected threshold voltage can be calculated as follows; the threshold voltage for a MOSFET is given by the following formula:

$$V_t = -q/C_{ox}\,[Q_{ss} + Q_{ox}] + \psi + \phi_{MS} + (q/C_{ox})\ Q_{SD} \quad (1)$$

where:

$V_t$ = threshold voltage
$q$ = electronic charge
$C_{ox}$ = gate capacitance per unit area
$Q_{SS}$ = charge density at gate oxide -semiconductor interface
$Q_{ox}$ = charge density in the oxide
$\psi$ = energy band bending
$\phi_{MS}$ = metal-to-semiconductor work function
$Q_{SD}$ = depletion region charge density For an n-channel MOS transistor these typically equal:

$Q_{SS} + Q_{ox} = 10''/cm^2$
$\psi = -1.0$ volt
$\phi_{MS} = -1.0$ volt
$q = 1.6 \times 10^{-19}$
$C_{ox} = 2.72 \times 10^{-8} f/cm^2$ $Q_{SD}$ is also related to the bulk charge density, $N_A$, by the following formula:

$$Q_{SD} = \sqrt{\frac{2\epsilon_0\epsilon_{si}}{q} N_A(|V_{BS} + \psi|)} \quad (2)$$

where:

$\epsilon_0\epsilon_{si}$ = dielectric constant of silicon
$V_{BS}$ = substrate to source back bias Typically, $\epsilon_0\epsilon_{si}$ equals $1.06 \times 10^{-12}$f/cm, thus for $V_{BS}$ equal to zero Equation (2) can be rewritten as:

$$Q_{SD} = 3.65 \times 10^3 \sqrt{N_A} \quad (3)$$

The depletion region charge density, $Q_{SD}$, and the bulk charge density, $N_A$, are related as follows:

$$Q_{SD} = x_d \cdot N_A \quad (4)$$

where $x_d$ equals the width of the depletion region with the transistor in the on state.

Thus for a desired threshold voltage the value of $Q_{SD}$ can be calculated from Equation (1). Using this value for $Q_{SD}$, the bulk charge density, $N_A$, can then be calculated from Equation (3) and for this value of $N_A$, the depletion region width, $x_d$, can be calculated from Equation (4). Typical values for a device having a gate oxide thickness of 1250 A are given in Table I below.

TABLE I

| $V_t$ (volts) | $Q_{SD}$ (charges/cm$^2$) | $N_A$ (charges/cm$^3$) | $x_d$ ($\mu$m) |
|---|---|---|---|
| −0.3 | $10^{11}$ | $8\times10^{14}$ | 1.25 |
| 0 | $1.5\times10^{11}$ | $1.8\times10^{15}$ | 0.83 |
| 0.5 | $2.33\times10^{11}$ | $4.3\times10^{15}$ | 0.54 |
| 1 | $3.16\times10^{11}$ | $8\times10^{15}$ | 0.40 |
| 1.5 | $4\times10^{11}$ | $1.5\times10^{16}$ | 0.3 |
| 2 | $5\times10^{11}$ | $2\times10^{16}$ | 0.25 |
| 3 | $6.5\times10^{11}$ | $3.4\times10^{16}$ | 0.19 |

Thus, for a selected threshold voltage, the three parameters $N_A$, $Q_{SD}$ and $x_d$ are defined. The implantation step is carried out to provide the required impurity density. However, during the gate oxide growth about one-half the implanted ions diffuse into the oxide layer. Therefore, the amount of impurity actually implanted is chosen to be about twice $Q_{SD}$.

Figure 14:
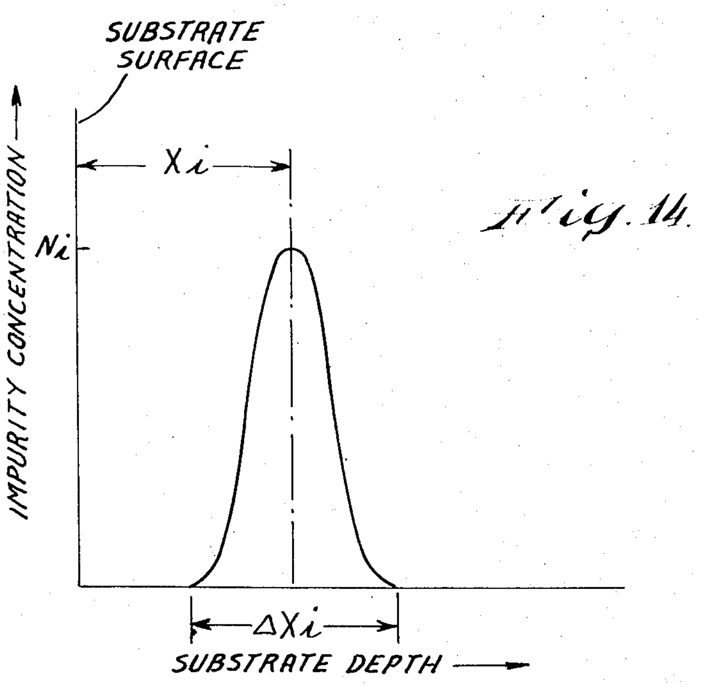
FIG. 14 is a graphical representation of the impurity distribution in the channel region of the device after ion implantation.

This method therefore can be used to provide a device having a selected threshold voltage. For example, for a device with boron as the p-type impurity implanted in the channel and having a desired threshold voltage of 1.5 volts, $Q_{SD}$ should equal $4 \times 10^{11}/cm^2$, $N_A$ should equal $1.5 \times 10^{16}/cm^3$ and $x_d$ should equal 0.3 $\mu$m (Table I). Therefore $8 \times 10^{11}/cm^2$ of boron is implanted using an implantation voltage of 25 Kvolts. The implantation profile is shown in FIG. 14. The maximum impurity concentration $N_i$ which is about equal to $2 \times 10^{19}/cm^3$ occurs at a depth $x_i$, which is about 700 A from the surface of the substrate, with a deviation of $\Delta x_i$ equal to about 200 A. To operate with the preselected threshold voltage, the impurities must be redistributed to provide an average impurity concentration equal to the calculated value of $N_A$ and an average depletion region width equal to the calculated value of $x_d$. This is accomplished during the growth of the gate oxide layer (step 10). While the gate oxide may be grown in a single growth step, it is preferred to use a two step process since it is easier to control the final impurity distribution.

During the growth of the gate oxide layer, impurities such as boron which are present in the substrate diffuse towards the surface of the substrate and into the oxide layer. By properly controlling the growth of the gate oxide layer, the surface charge density and depletion region width can be adjusted to provide the desired device threshold voltage. Typically an oxide layer equal in thickness to the depth, $x_i$, at which the maximum implanted impurity concentration occurs is grown during the first step. The first step is preferably carried out in a steam atmosphere in order for the growth to occur rapidly, thus preventing the implanted boron from diffusing far from its original location. During this growth, approximately 45 percent of the total oxide thickness is provided by the conversion of the silicon substrate to silicon dioxide while the remainder is provided by the deposition of silicon dioxide in the system. Typically this step is carried out at about 950°C in an atmosphere of oxygen saturated with steam. The boron diffusion length, $B_d$, is given by the formula $$B_d = 2 \sqrt{Dt} \quad (5)$$

where:

$D$ = diffusion coefficient of boron $t$ = diffusion time

Figure 15:
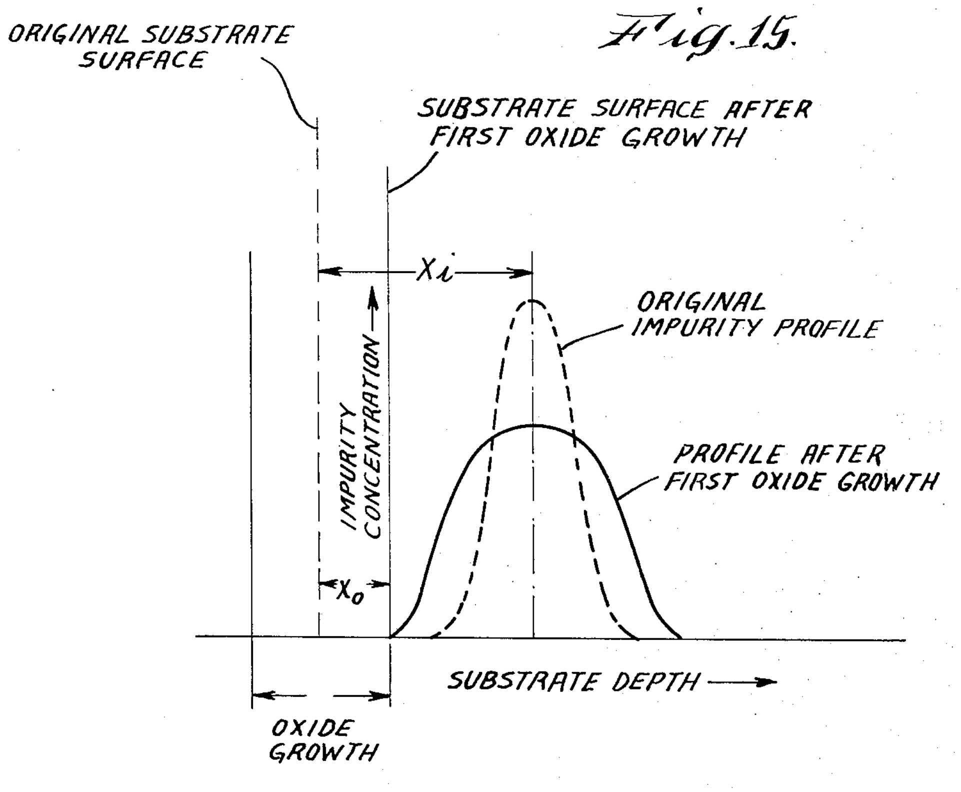
FIG. 15 is a graphical representation of the impurity distribution in the channel region after the first step in the growth of the gate oxide layer.
Figure 16:
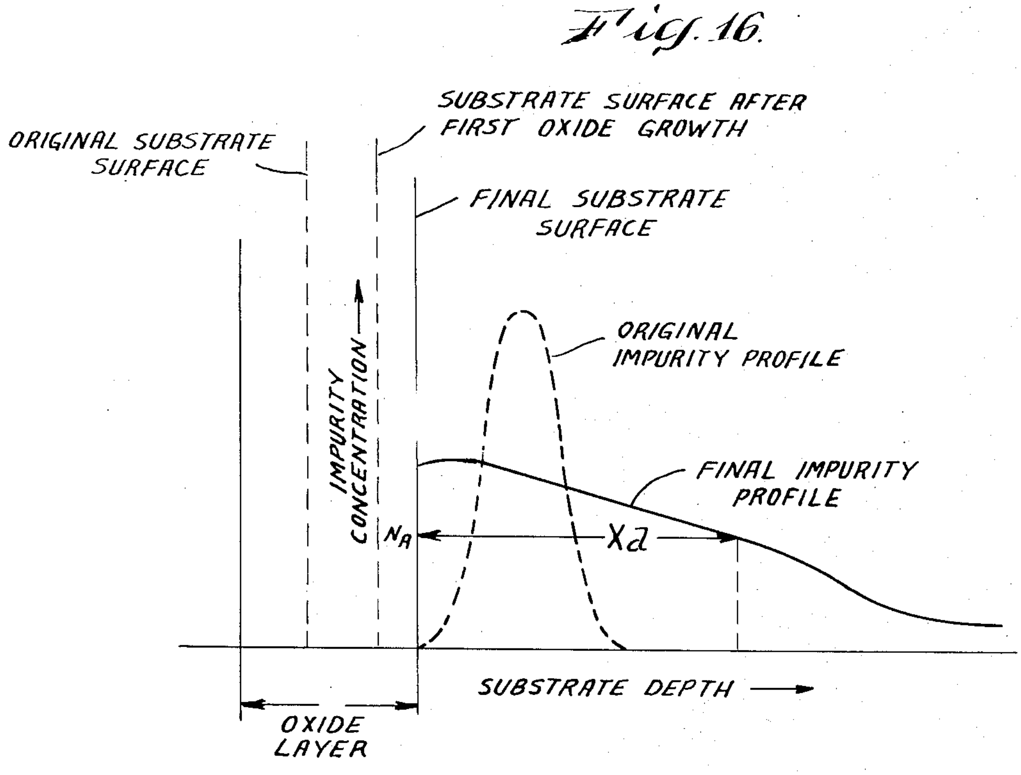
FIG. 16 is a graphical representation of the final impurity distribution in the channel region of the device.

The oxide growth time is chosen so that the lower edge of the boron distribution profile is approximately at the surface of the substrate after the first oxide growth. For example, it is known that at 950°C in steam a layer of silicon dioxide about 700 A thick will grow on a silicon substrate in about 10 minutes. Since 45 percent or 315 A is due to the conversion of the silicon substrate to silicon dioxide, the substrate surface has, in effect, been brought toward the implanted impurity by that distance. The diffusion length of boron during the 10 minute oxide growth, from Equation 5, is 320 A. Therefore a small amount of boron will have diffused a sufficient distance to be at the surface of the substrate causing a decrease in the maximum boron concentration. FIG. 15 shows changes in the boron impurity profile after the first oxide growth. The second oxide growth step is carried out by high temperature (typically 1050°C) diffusion in dry oxygen. At 1050°C, 1.25 hours are required to grow an oxide layer having a total thickness of 1250 A. From equation (5), the diffusion length of boron, which is equal to the width of the depletion region of the device, is equal to 0.3 microns and the bulk charge density at the silicon-silicon dioxide interface is about $3 \times 10^{16}/cm^3$ with an average bulk charge density of about $1.5 \times 10^{16}/cm^3$. From Table I, this device will have a threshold voltage of about 1.5 volts. FIG. 16 shows the boron distribution in the substrate after the second oxide growth step.

What I claim is:

1. A process for forming an n-channel enhancement field-effect semiconductor device comprising the steps of:

a. forming two spaced apart regions of n-type conductivity in a substrate having p-type conductivity;

b. implanting a layer of material of p-type conductivity in said substrate between said n-type regions, said layer being located at a predetermined depth below the surface of said substrate;

c. forming a layer of insulating material on the surface of said substrate, said insulating layer overlaying said layer of p-type material and at least partially overlaying said n-type regions;

d. diffusing said material of p-type conductivity in said implanted layer toward the surface of said substrate at the same time as forming said layer of insulating material; and e. forming three layers of a conductive material, the first of said layers being formed on said insulating layer, the second and third layers of conductive material being formed individually in the n-type regions.

2. The process of claim 1 wherein the resistivity of said substrate is at least 100 ohm-cm.

3. The process of claim 1 wherein said implanted material having p-type conductivity is boron.

4. The process of claim 1 which includes an initial step of diffusing a sheet of p-type conductivity material in the surface of silicon to form a substrate having p-type conductivity.

5. The process of claim 4 wherein said sheet of p-type conductivity has a resistivity of about 1300 ohms/-square centimeters.

6. The process of claim 1 wherein said layers of conductive material are aluminum.

7. The process of claim 1 wherein said layer of insulating material is silicon dioxide.

8. In a method of manufacturing an n-channel enhancement field-effect transistor having a drain, source, and channel region at the surface of a semiconductive substrate, said channel region located between said drain and source region, the improvement comprises forming the channel region by:

ion implanting a layer of p-type conductive material a predetermined depth beneath the surface of said substrate in the channel region;

heating said implanted substrate in an oxygen atmosphere to form an insulative oxide layer above said implanted layer and extending at least partially over said drain and source regions; and diffusing said implanted material toward the surface of said substrate at the same time as heating the substrate.

9. A process for making an n-channel enhancement field-effect semiconductor device comprising the steps of:

a. forming a thin sheet of p-type conductivity material in the surface of a silicon substrate;

b. diffusing material of n-type conductivity into two regions spaced apart in the p-type surface of the substrate;

c. ion implanting a layer of p-type conductive material between said n-type regions at a predetermined depth beneath the surface of said substrate;

d. heating said implanted substrate to a first temperature in a wet oxygen atmosphere to rapidly grow a silicon dioxide layer of insulating material and to control the diffusion of the implanted material, said silicon dioxide layer being located on the surface of said substrate overlaying said implanted layer and at least partially overlaying said n-type regions; and e. depositing three layers of conductive material, the first of said layers overlaying said insulating layer, and the second and third layers of conductive material being formed individually in contact with the n-type regions.

10. The process of claim 9 which includes after step (d) the additional step of heating said substrate to a second temperature in a dry oxygen atmosphere to diffuse said implanted material toward the surface of said substrate and to control the growth of the silicon dioxide layer.

11. The process of claim 10 wherein the first temperature is lower than the second temperature.

12. The process of claim 10 wherein the first temperature is 950°C and the second temperature is 1050°C.

* * * * *